United States Patent [19]

Balsells

[11] Patent Number: 5,411,348
[45] Date of Patent: May 2, 1995

[54] SPRING MECHANISM TO CONNECT, LOCK AND UNLOCK, MEMBERS

[75] Inventor: Peter J. Balsells, Santa Ana, Calif.

[73] Assignee: Bal Seal Engineering Company, Inc., Santa Ana, Calif.

[21] Appl. No.: 142,984

[22] Filed: Oct. 26, 1993

[51] Int. Cl.$^6$ ............................................. B25G 3/00
[52] U.S. Cl. ..................................... 403/326; 403/357; 285/318; 174/35 GC
[58] Field of Search ................. 174/35 GC; 285/318, 285/321; 403/372, 326, 357, DIG. 7; 411/352, 353, 348

[56] References Cited

U.S. PATENT DOCUMENTS

| | | | |
|---|---|---|---|
| 1,995,006 | 3/1935 | Mueller et al. | 285/321 X |
| 2,914,344 | 11/1959 | Anthes | 285/321 X |
| 4,529,257 | 7/1985 | Goodman et al. | 174/35 GC X |
| 4,655,462 | 4/1987 | Balsells | 277/164 |
| 4,678,210 | 7/1987 | Balsells | 285/318 |
| 4,805,943 | 2/1989 | Balsells | 285/318 |
| 4,826,144 | 5/1989 | Balsells | 267/167 |
| 4,830,344 | 5/1989 | Balsells | 267/167 |
| 4,876,781 | 10/1989 | Balsells | 29/173 |
| 4,893,795 | 1/1990 | Balsells | 267/1.5 |
| 4,907,788 | 3/1990 | Balsells | 267/168 |
| 4,915,366 | 4/1990 | Balsells | 267/167 |
| 4,934,666 | 6/1990 | Balsells | 267/1.5 |
| 4,961,253 | 10/1990 | Balsells | 29/173 |
| 4,964,204 | 10/1990 | Balsells | 29/173 |
| 4,974,821 | 12/1990 | Balsells | 267/167 |
| 5,072,070 | 12/1991 | Balsells | 174/35 GC |
| 5,079,388 | 1/1992 | Balsells | 174/35 GC |
| 5,082,390 | 1/1992 | Balsells | 285/318 X |
| 5,091,606 | 2/1992 | Balsells | 174/35 GC |
| 5,108,078 | 4/1992 | Balsells | 267/167 |
| 5,117,066 | 5/1992 | Balsells | 174/35 GC |
| 5,134,244 | 7/1992 | Balsells | 174/35 GC |
| 5,160,122 | 11/1992 | Balsells | 267/167 |
| 5,161,806 | 11/1992 | Balsells | 277/173 |
| 5,203,849 | 4/1993 | Balsells | 277/163 |

Primary Examiner—Dave W. Arola
Assistant Examiner—Anthony Knight
Attorney, Agent, or Firm—Walter A. Hackler

[57] ABSTRACT

A mechanism for connecting and disconnecting, locking and unlocking, and holding members to one another, and at the same time providing mechanical, electromagnetic shielding, electrical conductivity, and thermal dissipation, coupled with environmental sealing, is provided by a body having a groove and a coil spring disposed within the groove. A housing, having an opening sized to accommodate the body, is provided, and a tapered bottom in the groove prevents the spring from turning past a vertical line, thus locking or connecting the body with the housing.

16 Claims, 7 Drawing Sheets ized between members shown in FIGS. 1-4, generally
SPRING MECHANISM TO CONNECT, LOCK AND UNLOCK, MEMBERS The present invention generally relates to mechanisms for connecting and locking, connecting and unlocking, and connecting and holding two surfaces utilizing a canted-coil spring. More particularly, the surfaces may be rectilinear; and electromagnetic shielding, electrical conductivity, heat dissipation and environmental sealing may also be effected through the use of the present invention.

Canted-coil springs suitable for the present invention and a description thereof, along with the loading characteristics of such springs, may be found in U.S. Pat. Nos. 4,655,462; 4,826,144; 4,830,344; 4,876,781; 4,893,795; 4,907,788; 4,915,366; 4,934,666; 4,961,253; 4,964,204; 4,974,821; 5,072,070; 5,079,388; 5,108,078; 5,117,066; 5,134,244; 5,160,122; 5,161,806; and 5,203,849. All of these patents have been issued to Peter J. Balsells.

In addition, the hereinabove referenced issued patents, which are herewith incorporated by specific reference thereto, describe, in general, electromagnetic shielding effectiveness of coil spring assemblies, particularly U.S. Pat. Nos. 4,934,666; 5,079,388; and 5,134,244.

The present invention provides for a mechanism suitable for many mechanical and electrical applications. In particular, in electrical applications, the greatest suitability for the present invention combines environmental sealing with enhanced electrical conductivity. Through the use of an elastomer with a spring in intimate contact with surrounding coils is provided for achieving enhanced environmental sealing. The intimate contact between loaded points also enables a foreign material, such as moisture, dust or oxidation that may be present, thus providing an effective environmental seal.

SUMMARY OF THE INVENTION

A connect/disconnect, lock/unlock snap-on fastening and hold mechanism for mechanical, electromagnetic shielding, electrical conductivity and thermal dissipation, with further provision for environmental sealing, in accordance with the present invention, generally includes a body having a groove therein with generally parallel side walls. A coil spring is provided and disposed in the groove with a portion thereof protruding from the groove.

Further, in accordance with the present invention, a housing is provided which has an opening sized to accommodate the body. Groove means, disposed on an inside surface of the opening, are provided for receiving the protruding spring portion and for enabling assembly of the body within the opening when the body and housing are moved in one direction with respect to another.

In addition, means defining a tapered bottom in the groove is provided for preventing the spring from turning past a vertical line when the body and housing are moved in another direction with respect to one another. This structure prevents disassembly of the body and housing when they are moved in another direction with respect to one another.

More particularly in accordance with the present invention, the groove may have a groove width which is smaller than a coil height of the spring. In addition, the tapered bottom may join one of the general parallel side walls at an angle between about 0° and about 60°.

More preferably, the tapered bottom may join both parallel side walls at an angle between about 10° and 20°.

In another embodiment of the present invention, the tapered bottom may include two flat surfaces intersecting one another and each disposed at an acute angle to an adjoining parallel side wall. This enables the body and housing to be locked in both directions, as hereinafter described in greater detail.

Preferably, the spring includes coils sized for causing adjacent coils to abut one another upon assembly of the body within the opening in order to increase magnetic shielding, electrical conductivity, thermal dissipation and environmental sealing between the body and the housing.

Enhanced environmental sealing may be preferably enhanced by utilizing a spring filled with an elastomer which may be hollow or solid.

In an alternative embodiment of the present invention, a housing includes an opening therein having a groove with generally parallel side walls with a coil spring disposed therein with a portion protruding therefrom.

A body is sized for insertion into the opening, and groove means disposed on an outside surface of the body is provided for receiving the protruding spring portion and for enabling assembly of the body within the opening when the body and housing are moved in one direction with respect to one another.

In addition, means are provided for defining a tapered bottom in the groove for preventing the spring from turning past a vertical line when the body and housing are moved in another direction with respect to one another in order to prevent disassembly of the body and housing.

BRIEF DESCRIPTION OF THE DRAWINGS

The advantages and features of the present invention will be better understood by the following description when considered in conjunction with the accompanying drawings in which.

DETAILED DESCRIPTION

Turning now to FIGS. 1–4, there are shown several embodiments 10, 12, 14, 16 in accordance with the present invention, each generally-including a male part 18, 20, 22, 24 and a female part 26, 28, 30, 32.

Figures 5A, 5B, 5C:
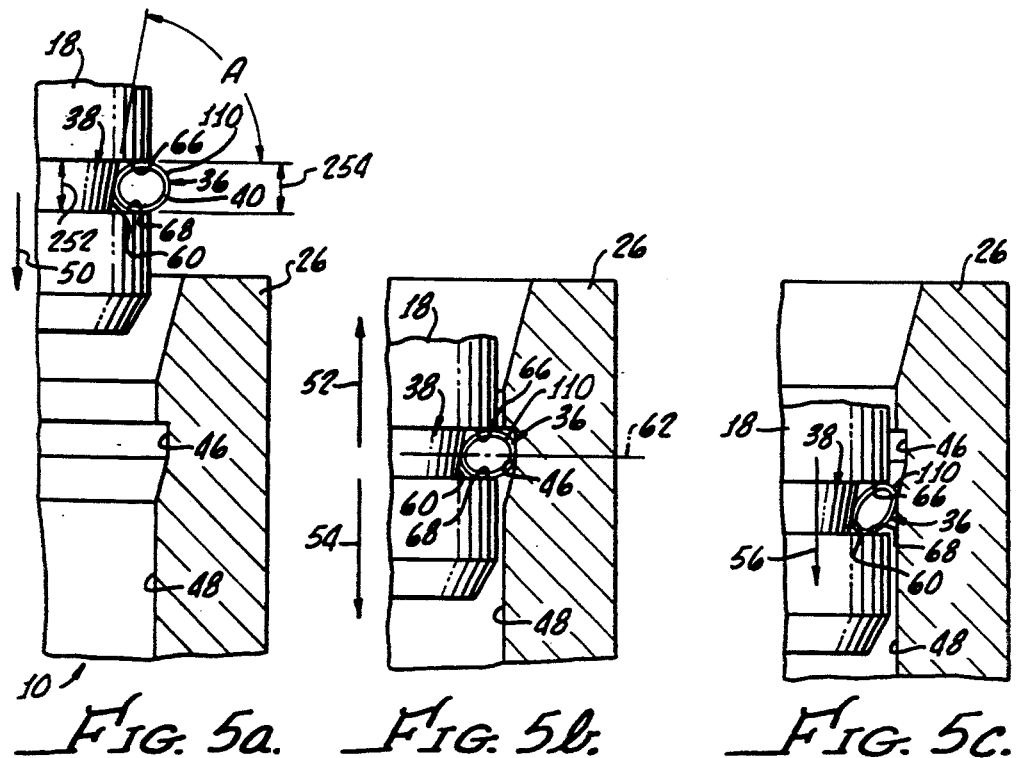
FIGS. 5a, 5b and 5c are representational cross section views of a lock and connect mechanism as may be utilized between members shown in FIGS. 1-4, generally showing a tapered bottom groove and a spring in various positions.

Turning to FIGS. 5a–5c, coil spring 36 is disposed within groove 38 in the male part 18 having a portion 110 protruding from the circumferential groove 36.

Figure 1:
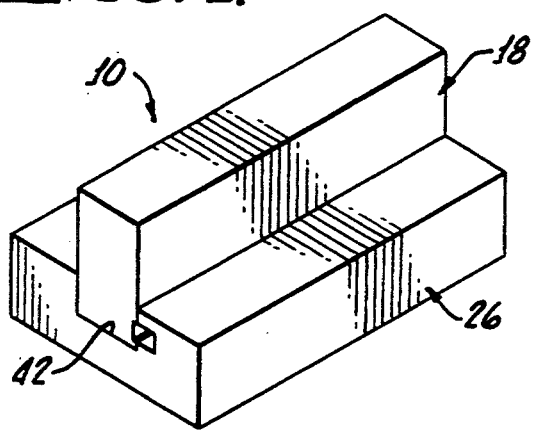
FIG. 1 is a perspective view of one embodiment in accordance with the present invention in which a spring is disposed between longitudinal members.
Figure 2:
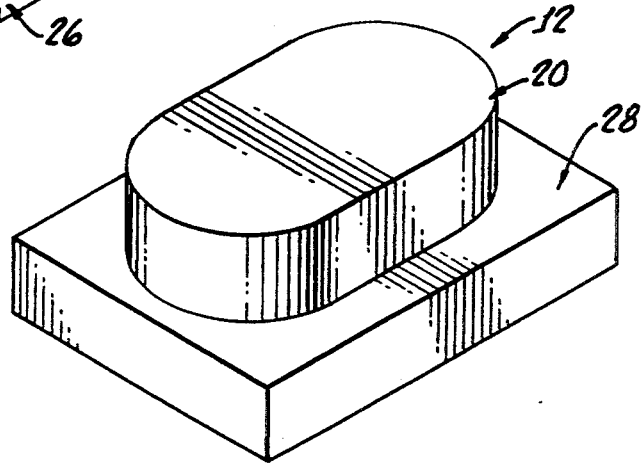
FIG. 2 is a perspective view of another embodiment in which a spring is disposed between curved and linear portions of mating members.
Figure 3:
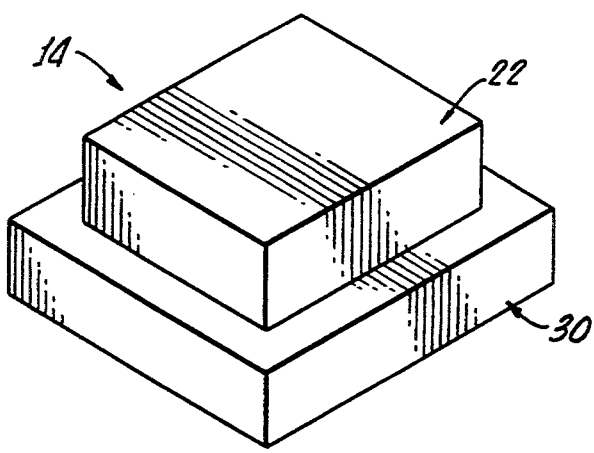
FIG. 3 is a perspective view of another embodiment in which a spring is disposed between members of rectangular shape.
Figure 4:
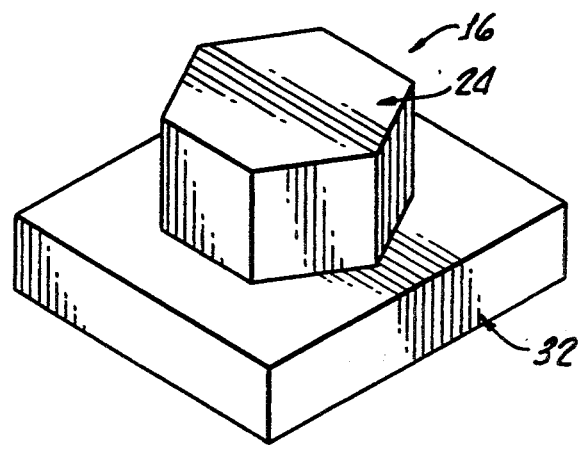
FIG. 4 is a perspective view of another embodiment in which a spring is disposed between members of hexagnal, shape.

The female part 26 includes a slot 42 which is sized for accommodating the male part 18 (see FIG. 1).

A groove 46, disposed on an inside surface 48 of the slot 42 (see FIGS. 5a–5c) provides a means for receiving the protruding spring portion 110 and for enabling assembly of the male part 18 within the slot 42 when the male part 18 and female part 26 are moved in the direction of arrow 50, shown in FIG. 5a. FIGS. 5a and 5c show the mechanism 10 in a disconnected, or unlocked, position and FIG. 5b shows the male part 18 in a connected, or locked, position with respect to the female part 26 against movement in the direction of arrow 52. The male and female parts may be disconnected upon movement in the direction of arrows 54, 56 as shown in FIGS. 5b, 5c.

A tapered bottom 60 of the groove 38 provides a means for preventing the spring 40 from turning past a line 62 (see FIG. 5b) when the male part 18 and female part 26 are moved in another, opposite, direction as indicated by the arrow 52. This prevents disassembly of the male part 18 and the female part 26 in the direction of the arrow 52. While the groove 38 bottom may be flat, improved reliability is achieved with the tapered bottom because it facilitates assembly and disassembly with minimum stress concentration on the spring 36. Further description of the spring 36-loading may be found in U.S. patent application entitled "Radially Mounted Spring to Connect, Lock and Unlock, Hold Snap-on Fastening, and for Mechanical, Electromagnetic Shielding, Electrical conductivity, Thermal Dissipation with Environmental Sealing" Ser. No. 08/143,913, filed on even date herewith, and such description is incorporated herein by this specific reference thereto.

FIG. 5b shows the spring 36 in a compressed position locking the male part 18 to the female part 26. As shown in FIG. 5b, the tapered bottom 60 may join both the parallel side walls 66, 68 at a tapered angle A. The degree of forced connect and unlock is substantially influenced by the taper angle A; the smaller the taper, the higher the force. As the taper angle increases, the force decreases. The angle A may vary from 0° to 89°, but preferably the angle A is between about 10° and about 20°.

Figures 6A, 6B, 6C:
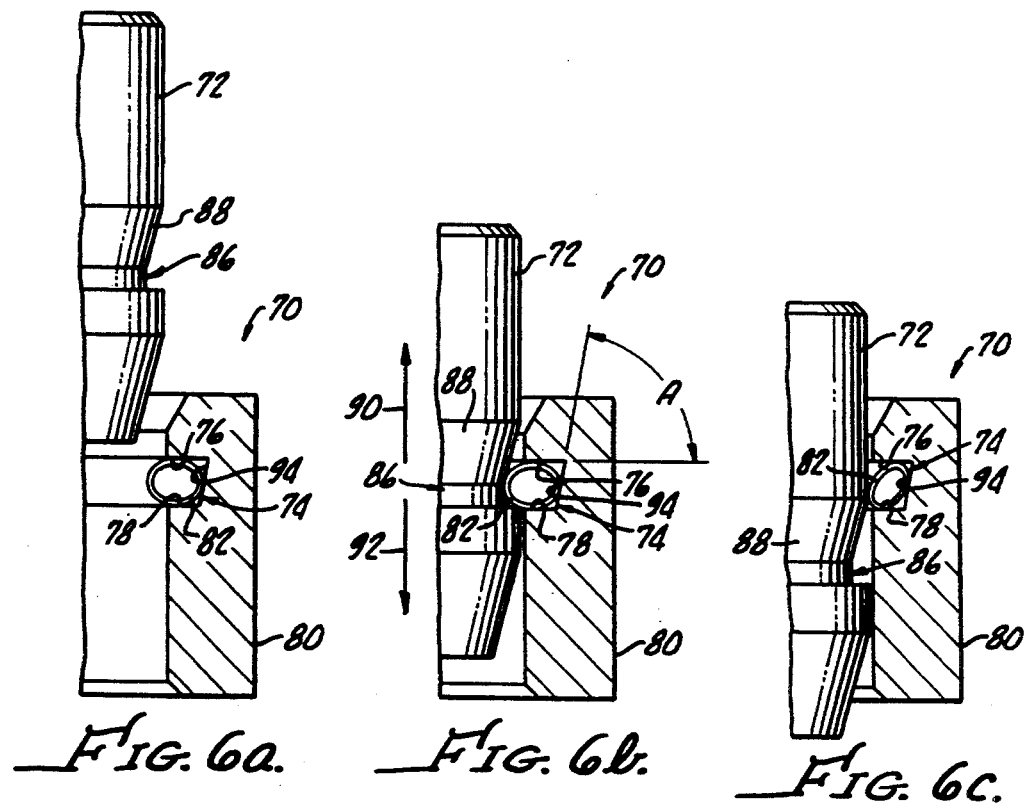
FIGS. 6a, 6b, and 6c are representational cross-section views of a lock and connect mechanism as may be utilized between members shown in FIGS. 1-4, generally showing a tapered bottom groove and a spring in various positions.
Figure 7A:
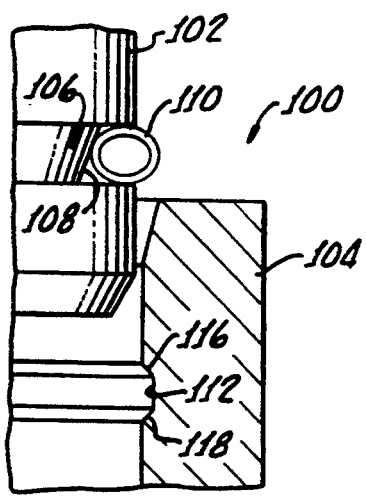
FIGS. 7a, 7b, 7c and 7d are representational cross-section views of a connect and unlock mechanism as may be utilized between members shown in FIGS. 1-4, generally showing a tapered bottom groove and a spring in various positions.
Figure 7B:
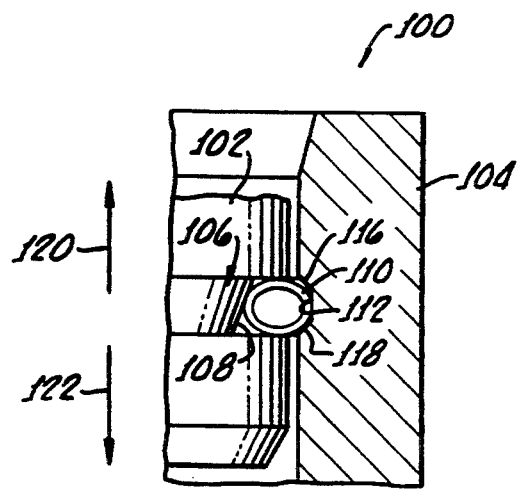
Figure 7C:
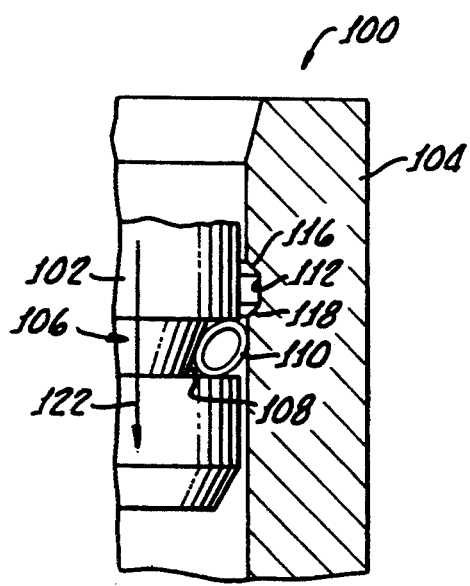
Figure 7D:
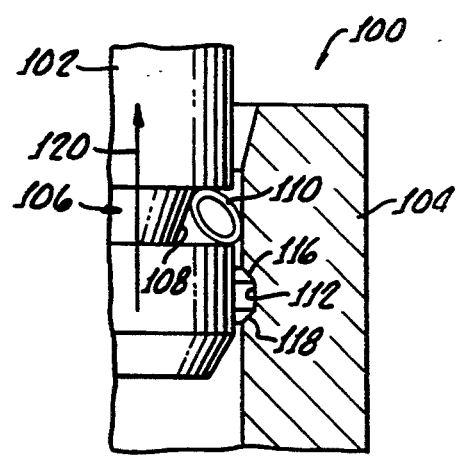

FIGS. 6a–6c show an alternative embodiment 70, in accordance with the present invention, having a male part 72 and a groove 74 with side walls 76, 78 disposed in a female part 80 with a spring 82 disposed therein. A groove 86 in the male part 72 having a ramp portion 88 functions in the same manner as the embodiment 10 shown in FIGS. 5a–5c. FIG. 6a shows the cylinder in an unlocked, or disconnected, position and FIGS. 6b, 6c show the male part 72 in a locked, or connected, position with respect to the female part 80.

Movement of the male part 72 in the direction of arrow 90 is prevented by the spring 82 while movement in the direction of arrow 92 enables the male part 72 to be disconnected from the female part 80. A tapered bottom 94 of the embodiment 70 provides a substantially greater degree of reliability because it facilitates assembly and disassembly with a minimum stress concentration acting on the spring, thus increasing its reliability.

In addition, the amount of locking force, as hereinabove noted, may be controlled by the angle A of the tapered bottom.

FIGS. 7a–7d show an alternative embodiment 100 which includes a male part 102 disposed within a female part 104. A groove 106 in the male part 102 includes a tapered bottom for supporting a spring 110. A detent 112 in the female part 104 includes ramp portions 116, 118 on each side thereof to facilitate assembly and connecting of the male part 102 with the female part 104 in both directions, as indicated by the arrows 120, 122.

Figure 8A:
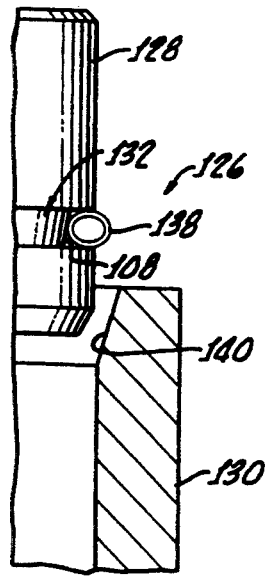
FIGS. 8a, 8b, 8c are representational cross-section views of a connect and hold mechanism as may be utilized between members shown in FIGS. 1–4, generally showing a tapered bottom groove and a spring in various positions.
Figure 8B:
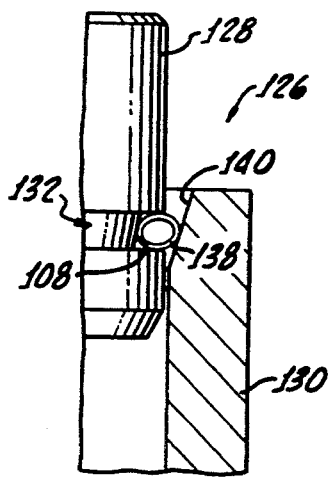
Figure 8C:
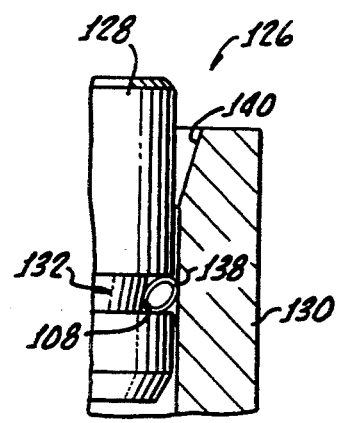

FIGS. 8a–8c show yet another embodiment 126, in accordance with the present invention, generally showing a male part 128 within a female part 130 with a groove 132 having a tapered bottom 108 for receiving a spring 138. A ramp portion 140 on the female part 130 facilitates assembly of the male part 128 within the female part 130.

Figure 9A:
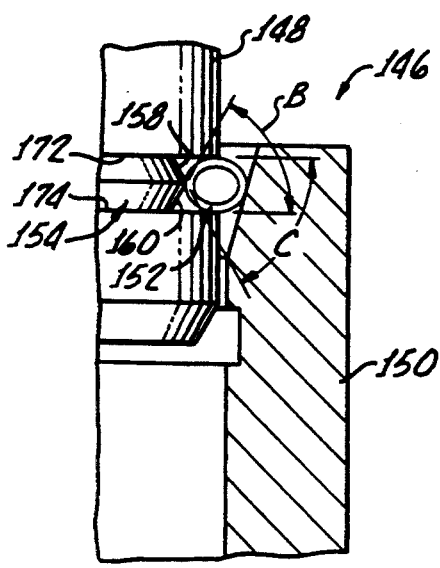
FIGS. 9a, 9b, 9c, and 9d are representational cross-section views of a bidirectional lock and connect mechanism as may be utilized between members shown in FIGS. 1–4, generally showing a tapered bottom groove and a spring in various positions.
Figure 9B:
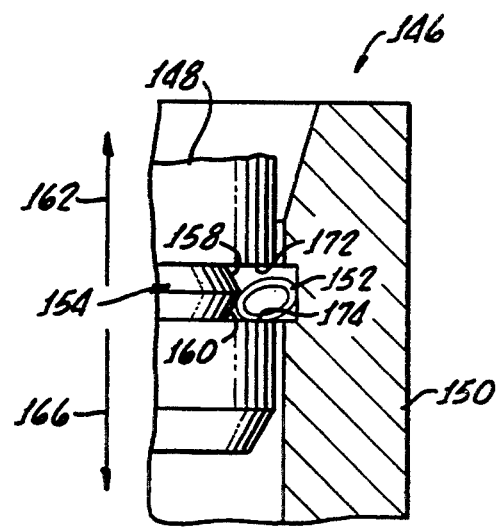
Figure 9C:
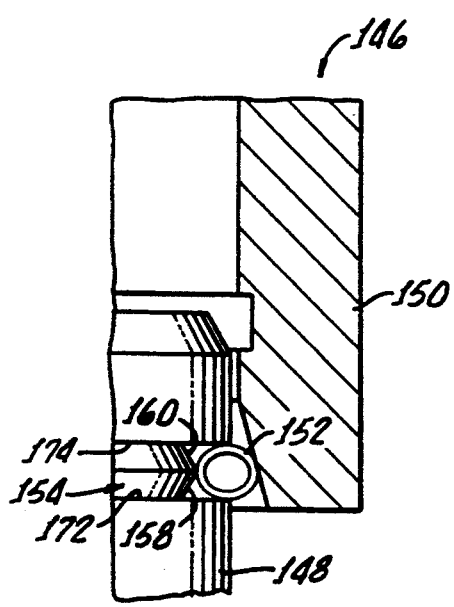
Figure 9D:
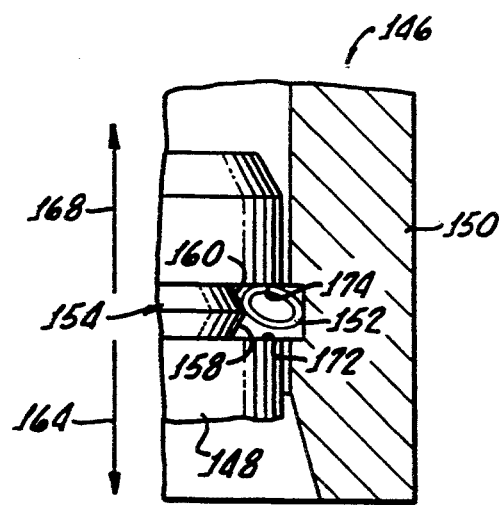

The embodiment 146, shown in FIGS. 9a-9d, enables a male part 148 to be connected and locked in both directions within a female part 150. For the purposes of the present description, this term means that the male part 148 is locked in one direction but can be disconnected in the opposite direction and, by switching the position of a spring 152 within a groove 154, having two tapered surfaces 158, 160 connect and lock can be achieved in the opposite direction. In FIGS. 9a and 9d, a locked position is indicated by the arrows 162, 164; and the unlocked position is indicated by the arrows 166, 168. As most clearly shown in FIG. 9a-9d, the tapered surfaces 158, 160 join respective groove side walls 172, 174 at angles B, C which are acute. Thus, depending upon the position of the spring 152, locking action can be achieved in one direction, as shown by the arrows 162, 164 or in the opposite direction, as indicated by the arrows 166, 168. In FIGS. 10a-10d there is yet another embodiment 180 in accordance with the present invention, which provides a snap-on connection between a male part 182 and a female plate 184. The male part 182 and female plate 184 are held together by means of a canted-coil spring 190. The male part 182 may be of any shape shown in FIGS. 1-4. In addition, the spring 190 may be mounted in the male part 182 as shown or in the female plate 184.

As shown in FIGS. 10a-10d, the groove 192 in the male part 182 includes a tapered bottom 194. The tapered bottom 194 permits substantially a greater degree of flexibility in assembly and the angle of the taper influences such flexibility as hereinabove noted. After the assembly takes place, it is necessary that the spring have sufficient force to snap outward and create the actual locking action that keeps the male part 182 and the female plate 184 together.

In addition, an outward groove side wall 198 may be disposed at an angle α for the purpose of preventing the spring 190 from vibrating out of the groove 192 and further provide a greater degree of reliability of performance.

Figure 10A:
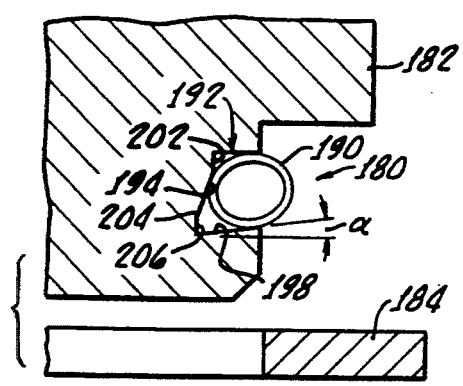
FIGS. 10a, 10b, 10c and 10d are representational cross-section views of a snap-on mechanism as may be utilized between members shown in FIGS. 1–4, generally showing a tapered bottom groove and a spring in various positions.
Figure 10B:
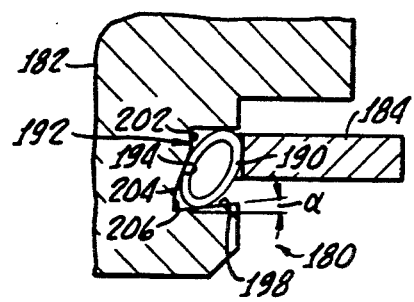
Figure 10C:
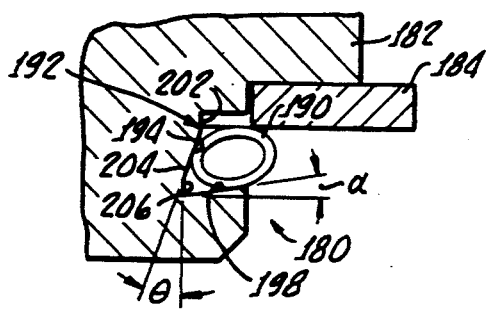
Figure 10D:
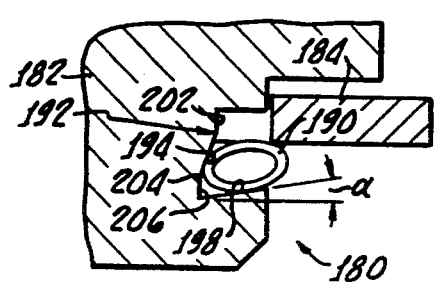

The spring 190 may be sized so that it is compressed in a manner that the coils will butt or nearly butt, as shown in FIG. 10d, to provide for effective electromagnetic shielding and improved electrical conductivity between the male part 182 and female plate 184 as well as provide improved thermal dissipation and environmental sealing. In this configuration, destruction of the spring 190 may be necessary in order to separate the male part 182 from the plate 184.

The tapered bottom 194 may be a compound surface having a plurality of angles Θ as illustrated in FIG. 10c. As shown, the compound surface comprises three contiguous surfaces, 202, 204, 206 which are configured for controlling the locking force of the spring 190.

Figure 11:
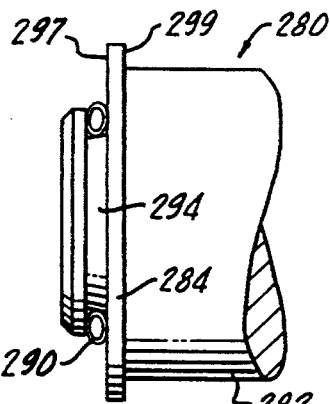
FIG. 11 is a fastener embodiment of the present invention showing a variation of a tapered bottom with the piston locked to a plate.

In FIG. 11 there is yet another embodiment 280 in accordance with the present invention, which provides a snap-on fastening connection between a cylindrical member 282 and a housing plate 284. The cylindrical member 282 and plate 284 are held together by means of a canted-coil spring 290. The member 282 may be cylindrical although means of fabrication to other geometries, such as rectangular or elliptical shape (not shown), may be utilized. In addition, the spring 290 may be mounted in the piston in a circular pattern as shown or in the housing.

Figure 12:
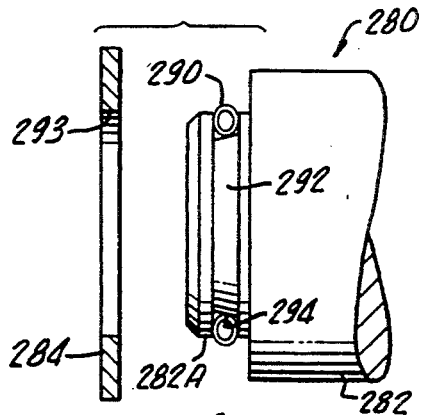
FIG. 12 is a view similar to the fastener embodiment shown in FIG. 11, showing the spring in a free position and the plate separated from the cylindrical body before assembly thereof.

FIG. 12 shows the embodiment 280 with the plate 284 separated from the cylindrical housing 282. A groove 292 in an end portion 282A has a tapered bottom 294.

Figure 14:
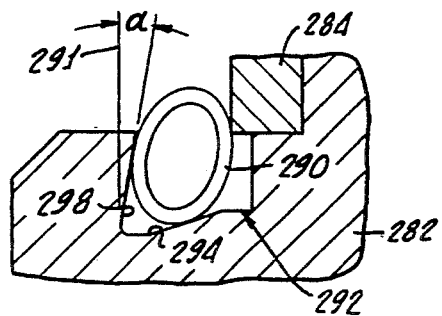
FIG. 14 is an enlarged view of the spring shown in FIG. 11.

As shown in FIG. 14, a tapered bottom 294 in the circumferential groove 292 prevents a spring 290 from rotating past a line 291 perpendicular to the cylindrical body axis in order to prevent disassembly of the cylindrical body 282 from the plate 284.

The plate 284 has a selected thickness and an opening 293 therein with a diameter greater than the diameter of the end portion 282A and smaller than the body 282 diameter for receiving the end portion 282A with the spring protruding, as shown in FIG. 11, from the circumferential groove 292 on a side 297 of the plate 284 opposite another side 299 of the plate 284 facing the cylindrical body 282.

Figure 13:
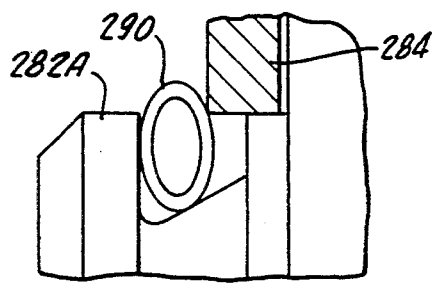
FIG. 13 is a view similar to the fastener embodiment shown in FIG. 14, showing the cylindrical body and plate member fully assembled.

Turning to FIG. 13, there is shown an enlarged view of the end portion 282A showing the spring 290 in a fully assembled position.

As most clearly shown in FIG. 14, the groove 292 in the member 282 includes a tapered bottom 294. The tapered groove 292 permits substantially a greater degree of flexibility in assembly and the angle of the taper influences such flexibility as hereinabove noted. After the assembly takes place, it is necessary that the spring have sufficient force to snap inward or outward and create the actual locking action that keeps the member 282 and the plate 184 together.

In addition, an outward groove side wall 298 may be disposed at an angle α for the purpose of preventing the spring 290 from vibrating out of the groove 292 and further provide a greater degree of reliability of performance.

The spring 290 may be sized so that it is compressed in a manner that the coils will butt or nearly butt to provide for effective electromagnetic shielding and improved electrical conductivity between the member 282 and plate 284 as well as provide improved thermal dissipation and environmental sealing. In this configuration, destruction of the spring 290 may be necessary in order to separate the member 282 from the plate 284.

Figure 15:
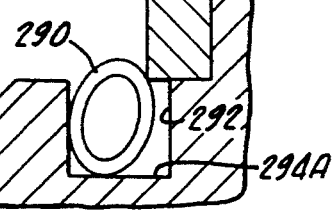
FIG. 15 is an alternative view of the present invention in which the groove has a flat bottom.

FIG. 15 is an alternative embodiment of the present invention in which the groove 292 includes a flat bottom 294A, While performance with this configuration may be adequate in certain snap-on fastening applications, it is preferred that the groove 292 bottom be tapered as hereinabove described.

Figure 16:
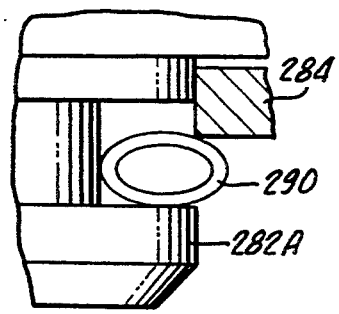
FIG. 16 is a view similar to the fastener embodiment shown in FIG. 15 with a spring butted against a plate, thereby preventing disassembly of the cylindrical body and the plate.

FIG. 16 is a view similar to FIG. 15 showing the spring 290 in a compressed or butted position with respect to the plate 284 and the end portion 282A, thereby preventing disassembly of the plate 284 from the cylindrical body 282.

Figure 17:
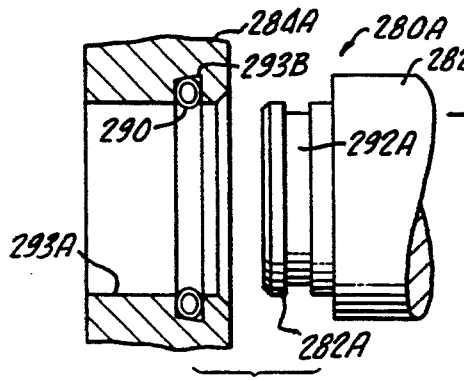
FIG. 17 shows a snap-on embodiment in which the cylindrical body is fastened to a housing.

FIG. 17 is another alternative snap-on fastener mechanism 280A which includes a cylindrical body 282 said tapered bottom being tapered with respect to the side walls, with an end portion 282B with a groove 292A fastening, with housing 284A having a bore 293A with a groove 293B therein. The snap-on fastening operation is similar to that described in connection with the embodiment 280 shown in FIG. 12.

Figure 18:
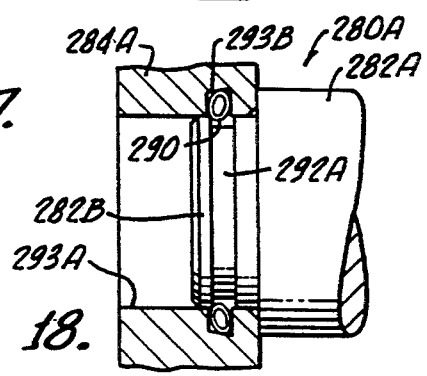
FIG. 18 is similar to the embodiment shown with the cylindrical body inserted into the housing.

FIG. 18 is a view similar to FIG. 17 with the cylinder 282 said tapered bottom being tapered with respect to the side walls, in engagement with the housing 284A.

Figure 19A:
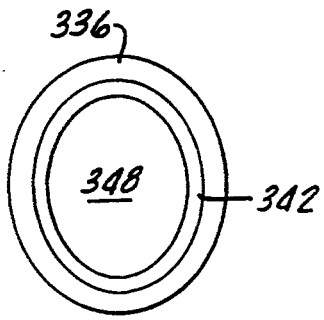
FIGS. 19a and 19b are cross-sectional views of an elastomer-filled spring having a hollow center suitable for use in the present invention.
Figure 19B:
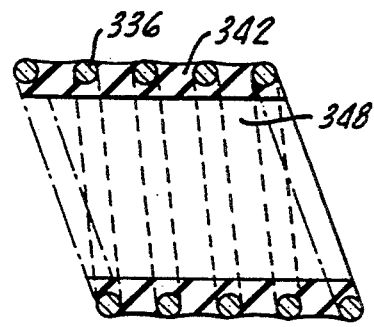
Figure 20A:
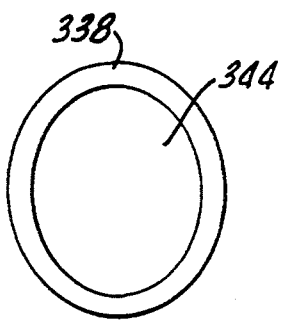
FIGS. 20a and 20b are views of an alternative embodiment of the spring suitable for use in the present invention having a solid elastomer therein.
Figure 20B:
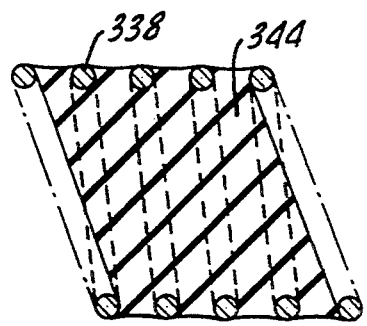

Environmental sealing may be enhanced for any of the hereinabove described embodiments by filling springs 336, 338, 340 with elastomer 342, 344, 346, as shown in FIGS. 19a-19b; 20a-20b; and 21a-21b.

Figure 21A:
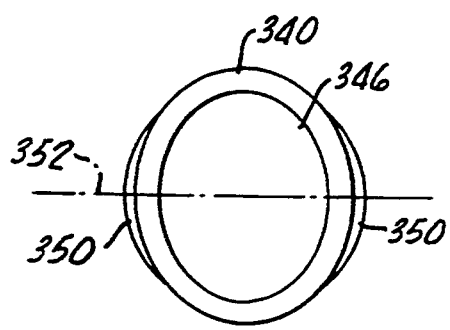
FIGS. 21a and 21b are views of another embodiment of the spring in accordance with the present invention having an elastomer therein extending exterior to the coils along minor axis thereof.
Figure 21B:
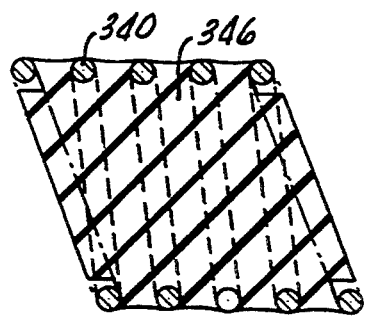

With specific reference to FIG. 19a and 19b, the elastomer may have a hollow center 348 or, as shown in FIG. 21a, the elastomer may have portions 350 protruding beyond the spring 340 along a minor axis 352 thereof. Canted-coil, elastomer-filled spring assemblies suitable for the present invention are taught in U.S. Pat. No. 5,161,806, as hereinabove noted, which is incorporated herewith by this specific reference thereto for teaching elastomer filled springs.

For applications that require electromagnetic shielding, electrical conductivity, or heat dissipation, or a combination of them, it is necessary that upon loading of the spring 336, 338, 340 that the portion under load, the protruding portion, provides electrical conductivity which is achieved by bearing the spring wire at the loading points of contact so that such electrical conductivity is enabled.

To achieve the highest degree of conductivity and reliability, as well as environmental sealing, the highest reciprocity possible should be achieved at the loading points, and this occurs when the groove width 352, as shown in FIG. 5a, is smaller than the coil height 354 with a very small tapered bottom, resulting in a high load along the major axis of the elliptical coil 36. The intimate contact between the loading points also eliminates foreign material, such as dust or oxidation that may be present, from entering the groove 38, thus providing effective environmental sealing.

Although there has been hereinabove described specific embodiments of the present invention, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A connect/disconnect, lock/unlock and hold mechanism for mechanical, electromagnetic shielding, electrical conductivity, and thermal dissipation coupling with environmental sealing, the mechanism comprising:
   a body having a groove therein with generally parallel side walls;
   a coil spring disposed in said groove with a portion thereof protruding from said groove;
   a housing having a means, defining an opening for accommodating said body and groove means, disposed in an inside surface of said opening, for receiving the protruding spring portion and for enabling assembly of the body within the opening when the body and housing are moved in one direction with respect to one another; and
   means, defining a tapered bottom in said groove, said tapered bottom being tapered with respect to the side walls, for preventing the spring from turning past a vertical line when the body and housing are moved in another direction with respect to one another in order to prevent disassembly of the body and housing.

2. The mechanism according to claim 1 wherein the groove has a groove width which is smaller than a coil height of the spring.

3. The mechanism according to claim 2 wherein the tapered bottom joins one of the generally parallel side walls at an angle between about 10° and about 4. The mechanism according to claim 2 wherein the tapered bottom joins both parallel side walls at an angle between about 10° and about 20°.

5. The mechanism according to claim 2 wherein said tapered bottom comprises two flat surfaces intersecting one another and each disposed at an acute angle to an adjoining parallel side wall.

6. The mechanism according to claim 1 wherein said coil spring includes coils sized for causing adjacent coils to abut one another upon assembly of the body within the opening in order to increase electromagnetic shielding, electrical conductivity, thermal dissipation and environmental sealing between the body and housing.

7. The mechanism according to claim 1 further comprising an elastomer disposed within said continuous spring.

8. The mechanism according to claim 7 wherein said elastomer has a hollow core.

9. A connect/disconnect, lock/unlock and hold mechanism for mechanical, electromagnetic shielding, electrical conductivity, and thermal dissipation coupling with environmental sealing, the mechanism comprising:
   a housing including means defining an opening therein having a groove with generally parallel side walls;
   a coil spring disposed in said groove with a portion thereof protruding from said groove;
   a body sized for insertion into said opening and groove means, disposed on an outside surface of said body, for receiving the protruding spring portion and for enabling assembly of the body within the opening when the body and housing are moved in one direction with respect to one another; and
   means, defining a tapered bottom in said groove, said tapered bottom being tapered with respect to the side walls, for preventing the spring from turning past a vertical line when the body and housing are moved in another direction with respect to one another in order to prevent disassembly of the body and housing.

10. The mechanism according to claim 9 wherein the groove has a groove width which is smaller than a coil height of the spring.

11. The mechanism according to claim 10 wherein the tapered bottom joins one of the generally parallel side walls at an angle between about 10° and about 12. The mechanism according to claim 10 wherein the tapered bottom joins both parallel side walls at an angle between about 10° and about 20°.

13. The mechanism according to claim 10 wherein said tapered bottom comprises two flat surfaces intersecting one another and each disposed at an acute angle to an adjoining parallel side wall.

14. The mechanism according to claim 9 wherein said spring includes coils sized for causing adjacent coils to abut one another upon assembly of the body within the opening in order to increase electromagnetic shielding, electrical conductivity, thermal dissipation and environmental sealing between the body and housing.

15. The mechanism according to claim 9 further comprising an elastomer disposed within said spring.

16. The mechanism according to claim 15 wherein said elastomer has a hollow core.

* * * * *